(12) United States Patent
Tago et al.

(10) Patent No.: US 9,854,677 B2
(45) Date of Patent: Dec. 26, 2017

(54) MODULE COMPONENT

(71) Applicant: Murata Manufacturing Co., Ltd., Nagaokakyo-shi, Kyoto-fu (JP)

(72) Inventors: Shigeru Tago, Nagaokakyo (JP); Hirofumi Shinagawa, Nagaokakyo (JP); Masaki Kawata, Nagaokakyo (JP); Yuki Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/214,611

(22) Filed: Jul. 20, 2016

(65) Prior Publication Data

US 2016/0330843 A1 Nov. 10, 2016

Related U.S. Application Data

(63) Continuation of application No. PCT/JP2015/073951, filed on Aug. 26, 2015.

(30) Foreign Application Priority Data

Sep. 3, 2014 (JP) ................................ 2014-178686
Nov. 28, 2014 (JP) ................................ 2014-241097

(51) Int. Cl.
*H05K 1/18* (2006.01)
*H05K 1/11* (2006.01)
(Continued)

(52) U.S. Cl.
CPC ............... *H05K 1/181* (2013.01); *H05K 1/11* (2013.01); *H05K 1/111* (2013.01); *H05K 1/118* (2013.01);
(Continued)

(58) Field of Classification Search
CPC ........ H05K 1/181; H05K 1/0393; H05K 1/11; H05K 3/32
(Continued)

(56) References Cited

U.S. PATENT DOCUMENTS

2001/0018982 A1* 9/2001 Gotoh .................... H01L 24/81
174/250
2001/0051396 A1 12/2001 Iwahashi et al.
(Continued)

FOREIGN PATENT DOCUMENTS

JP 11-40942 A 2/1999
JP 2001-308141 A 11/2001
(Continued)

OTHER PUBLICATIONS

Official Communication issued in corresponding Japanese Patent Application No. 2016-524626, dated Jul. 19, 2016.
(Continued)

*Primary Examiner* — Timothy Thompson
*Assistant Examiner* — Charles Pizzuto
(74) *Attorney, Agent, or Firm* — Keating & Bennett, LLP

(57) ABSTRACT

A module component includes a substrate including a liquid crystal polymer resin sheet, and an electronic component mounted on the substrate by ultrasonic bonding, wherein the electronic component includes a plurality of first substrate connecting electrodes including respective planar conductors provided on a substrate mounting surface separately from each other, and connected at a same potential or substantially a same potential, and the substrate includes a first component connecting electrode including a planar conductor provided on a component loading surface, and bonded to the plurality of first substrate connecting electrodes.

19 Claims, 4 Drawing Sheets

(51) Int. Cl.
*H05K 3/32* (2006.01)
*H05K 1/03* (2006.01)
(52) U.S. Cl.
CPC ............... *H05K 3/32* (2013.01); *H05K 3/328* (2013.01); *H05K 1/0393* (2013.01); *H05K 2201/0129* (2013.01); *H05K 2201/0141* (2013.01); *H05K 2201/0154* (2013.01); *H05K 2201/05* (2013.01); *H05K 2203/0285* (2013.01); *Y02P 70/611* (2015.11)
(58) Field of Classification Search
USPC ........................................................ 174/254
See application file for complete search history.

(56) References Cited

U.S. PATENT DOCUMENTS

| | | | | |
|---|---|---|---|---|
| 2007/0008051 | A1* | 1/2007 | Tsuda | H03H 3/08 333/193 |
| 2014/0167273 | A1* | 6/2014 | Kim | H01L 21/6836 257/773 |
| 2014/0225152 | A1* | 8/2014 | Asahi | H01L 33/62 257/99 |
| 2014/0273289 | A1* | 9/2014 | Omura | H01L 33/0095 438/4 |
| 2014/0321086 | A1* | 10/2014 | Adachi | H05K 1/188 361/762 |
| 2015/0113799 | A1* | 4/2015 | Takada | H05K 1/0212 29/739 |
| 2015/0294754 | A1* | 10/2015 | Ohata | C08J 3/12 428/195.1 |
| 2015/0373854 | A1* | 12/2015 | Ikemoto | H04N 5/2257 361/767 |
| 2016/0212845 | A1* | 7/2016 | Nakashima | H05K 1/0326 |

FOREIGN PATENT DOCUMENTS

| | | |
|---|---|---|
| JP | 2003-347336 A | 12/2003 |
| JP | 2004-111942 A | 4/2004 |
| JP | 2004-273552 A | 9/2004 |
| JP | 2006-120683 A | 5/2006 |
| JP | 2011-210789 A | 10/2011 |
| JP | 2014-103262 A | 6/2014 |
| WO | 2013/069232 A1 | 5/2013 |

OTHER PUBLICATIONS

Official Communication issued in International Patent Application No. PCT/JP2015/073951, dated Nov. 24, 2015.

* cited by examiner

MODULE COMPONENT

CROSS REFERENCE TO RELATED APPLICATIONS

This application claims the benefit of priority to Japanese Patent Applications 2014-178686 filed Sep. 3, 2014 and 2014-241097 filed Nov. 28, 2014 and is a Continuation Application of PCT/JP2015/073951 filed on Aug. 26, 2015. The entire contents of each application are hereby incorporated by reference.

BACKGROUND OF THE INVENTION

1. Field of the Invention

The present invention relates to a technology for mounting a surface mounting type electronic component on a substrate. Particularly, the present invention relates to a module component mounted with an electronic component on a substrate by utilizing an ultrasonic bonding method.

2. Description of the Related Art

Conventionally, a substrate having flexibility (flexible substrate) is constituted as a resin multilayer substrate. In a resin multilayer substrate formed of thermoplastic resin such as a liquid crystal polymer, when a method for mounting an electronic component with heating such as soldering is used, thermoplastic resin is sometimes softened at the time of mounting the electronic component. In this case, sufficient pressure cannot be applied between the electronic component and the substrate, and a bond strength of the electronic component and the substrate is sometimes weakened.

Therefore, as a method for mounting an electronic component on a substrate formed of thermoplastic resin, an ultrasonic bonding method is sometimes used (for example, refer to JP 2006-120683 A). JP 2006-120683 A discloses a configuration in which when an electronic component is bonded onto a substrate by ultrasonic bonding, the direction in which the electronic component is ultrasonically oscillated is defined as the direction along crystalline orientation of a liquid crystal polymer in the substrate.

Even in the configuration described in JP 2006-120683 A, there is a case where the bond strength of the electronic component and the substrate is not sufficient.

SUMMARY OF THE INVENTION

Preferred embodiments of the present invention provide a module component capable of reliably achieving sufficient bond strength of an electronic component mounted on a substrate made of thermoplastic resin.

A module component according to a preferred embodiment of the present invention includes a substrate including a thermoplastic resin base material, and an electronic component ultrasonically bonded on the substrate, wherein the electronic component includes a plurality of first substrate connecting electrodes including respective planar conductors provided on a substrate mounting surface separately from each other, and connected at a same potential or substantially a same potential, and the substrate includes a first component connecting electrode including a planar conductor provided on a component loading surface, and bonded to the plurality of first substrate connecting electrodes.

Deformation (including deformation and flow) of the thermoplastic resin base material hardly occurs near the component connecting electrode in the substrate. Therefore, in this configuration, the plurality of first substrate connecting electrodes connected at the same or substantially the same potential in the electronic component are bonded to the first component connecting electrode including the planar conductor provided on the component loading surface of the substrate. Consequently, the first component connecting electrode is provided on the substrate so as to have a larger area than usual, and a portion, in which the first substrate connecting electrodes do not abut, in a region where the first component connecting electrode is located is provided at a position between the plurality of first substrate connecting electrodes. In this portion, in which the first substrate connecting electrodes do not abut, the quantity of heat generated by oscillation of the ultrasonic bonding is small, the thermoplastic resin base material near this portion is hardly deformed compared to a portion in which the quantity of generated heat is large. This hardly deformed portion plays a role as an anchor, and it is possible to significantly reduce or prevent deformation of the thermoplastic resin near the first component connecting electrode. Therefore, it is possible to significantly reduce or prevent deformation in the mounting region of the electronic component in the substrate. Consequently, even in a case where the electronic component is mounted on the substrate by a method involving oscillation or generation of frictional heat (heat generation) such as an ultrasonic bonding method, the electronic component and the substrate are able to be reliably bonded to each other with sufficient bond strength.

The electronic component preferably further includes a second substrate connecting electrode including a planar conductor provided on the substrate mounting surface separately from the first substrate connecting electrodes, and connected at a different potential or a substantially different potential from the first substrate connecting electrodes, and the substrate preferably further includes a second component connecting electrode including a planar conductor provided on the component loading surface separately from the first component connecting electrode, and bonded to the second substrate connecting electrode, and the first component connecting electrode surrounds the second component connecting electrode.

In this configuration, the thermoplastic resin is hardly deformed near the second component connecting electrode whose periphery is surrounded by the first component connecting electrode. Therefore, it is possible to further significantly reduce or prevent the deformation in the mounting region of the electronic component in the substrate.

The substrate may further include a first interlayer connection conductor provided inside the substrate and electrically conducted with the first component connecting electrode. Particularly, the substrate preferably includes a plurality of the first interlayer connection conductors.

Near the interlayer connection conductors in the substrate, the interlayer connection conductors each play a role as an anchor, and therefore deformation or flow hardly occurs in the thermoplastic resin base material, and the first component connecting electrode connected to the interlayer connection conductors also hardly moves. Therefore, a large number of the first interlayer connection conductors electrically conducted with the first component connecting electrode are provided, so that it is possible to further significantly reduce or prevent the deformation in the mounting region of the electronic component in the substrate.

The first interlayer connection conductor is preferably electrically conducted with a portion between respective bonding regions of the plurality of first substrate connecting electrodes, in one of the first component connecting electrodes.

In this configuration, it is possible to enhance flatness in the bonding regions of the plurality of first substrate connecting electrodes, in the one first component connecting electrode, and bond strength of the electronic component and the substrate is further stabilized.

The substrate preferably further includes a first inner layer planar conductor electrically conducted with the first component connecting electrode through the first interlayer connection conductor. Particularly, the first inner layer planar conductor preferably overlaps with the first component connecting electrode.

Near the inner layer planar conductor in the substrate, deformation or flow hardly occurs in the thermoplastic resin by an amount separated from a heat generation portion by the ultrasonic bonding. Therefore, the inner layer planar conductor and the interlayer connection conductor play roles as a supporting layer and an anchor respectively, and it is possible to further significantly reduce or prevent deformation of the thermoplastic resin base material and movement of the first component connecting electrode. Therefore, the first inner layer planar conductor electrically conducted with the first component connecting electrode is provided, so that it is possible to further significantly reduce or prevent the deformation in the mounting region of the electronic component in the substrate.

The first component connecting electrode preferably includes a long side and a short side, and an elastic modulus of the substrate in a direction in which the long side of the first component connecting electrode extends is preferably lower than an elastic modulus of the substrate in a direction in which the short side of the first component connecting electrode extends.

Deformation of the thermoplastic resin near the component connecting electrode in the direction in which the long side of the component connecting electrode extends is further significantly reduced or prevented. Therefore, in a case of a substrate having anisotropy in an elastic modulus like a liquid crystal polymer, the component connecting electrode has a structure such that the long side extends in a direction in which the elastic modulus is low, so that it is possible to further significantly reduce or prevent the deformation in the mounting region of the electronic component in the substrate.

According to a preferred embodiment of the present invention, the plurality of first substrate connecting electrodes of the electronic component are mounted on the first component connecting electrode provided as the planar conductor continuous to the component loading surface of the substrate, and therefore the component connecting electrode is able to have a large area, and it is possible to significantly reduce or prevent the deformation of the thermoplastic resin in the mounting region of the electronic component in the substrate. Therefore, it is possible to significantly reduce or prevent peeling and dropping of the electronic component from the substrate, or occurrence of contact failure.

The above and other elements, features, steps, characteristics and advantages of the present invention will become more apparent from the following detailed description of the preferred embodiments with reference to the attached drawings.

DETAILED DESCRIPTION OF THE PRESENT INVENTION

First, a module component 9 according to a first preferred embodiment of the present invention will be described.

Figure 1:
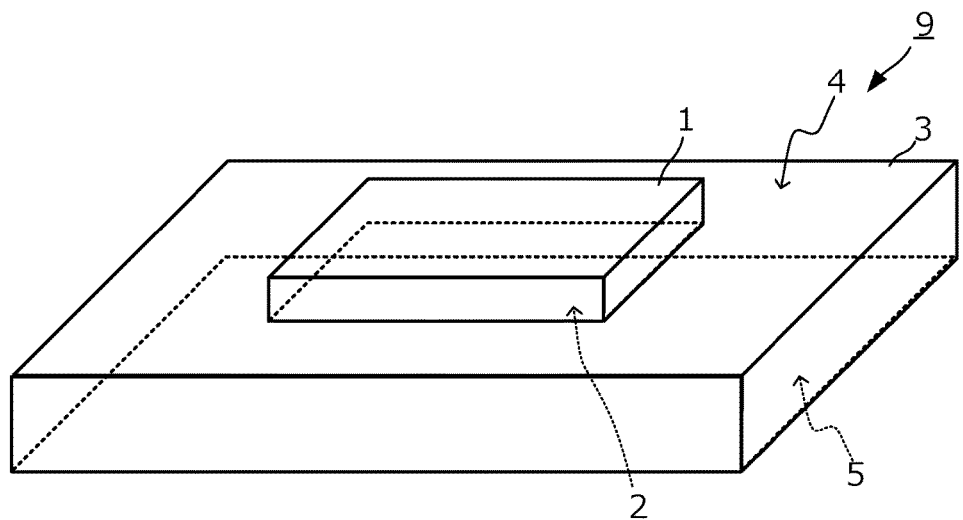
FIG. 1 is a perspective view of a module component according to a first preferred embodiment of the present invention.

FIG. 1 is a perspective view as the module component 9 is viewed from a top surface side.

The module component 9 includes an electronic component and a substrate 3. The electronic component 1 includes a substrate mounting surface 2. The substrate 3 includes a component loading surface 4 and an external mounting surface 5. The substrate mounting surface 2 of the electronic component 1 is mounted on the component loading surface 4 of the substrate 3.

Figure 2:
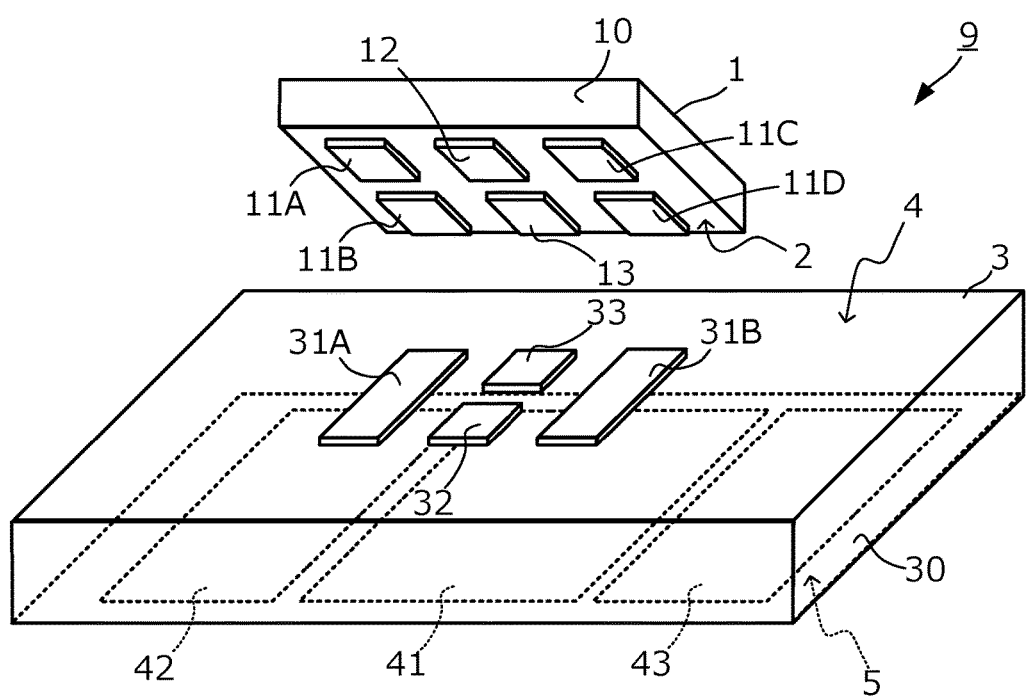
FIG. 2 is an exploded schematic perspective view of the module component according to the first preferred embodiment of the present invention.

FIG. 2 is an exploded schematic perspective view of the module component 9. The electronic component 1 includes a body 10, and substrate connecting electrodes 11A, 11B, 11C, 11D, 12, 13.

The body 10 preferably has a hexahedron shape, for example. One of outer surfaces of the body 10 is the substrate mounting surface 2. As long as the body 10 includes the substrate mounting surface 2, the body 10 may have any shape and any configuration.

The substrate connecting electrodes 11A, 11B, 11C, 11D, 12, 13 preferably include respective square or substantially square planar conductors provided on the substrate mounting surface 2 separately from each other. In one example configuration, each three of the substrate connecting electrodes 11A, 11B, 11C, 11D, 12, 13 are arranged in two lines along the lateral width direction on the substrate mounting surface 2. Adjacent ones of the substrate connecting electrodes 11A, 11B, 11C, 11D, 12, 13 are disposed at predetermined intervals.

The substrate connecting electrodes 11A, 11B, 11C, 11D are each an example of a first substrate connecting electrode, and are connected at the same potential or substantially the same potential. The substrate connecting electrode 12 and the substrate connecting electrode 13 are each an example of a second substrate connecting electrode, and are connected at a different potential or a substantially different potential from the substrate connecting electrodes 11A, 11B, 11C, 11D. Herein, the substrate connecting electrodes 11A, 11B, 11C, 11D each defines and functions as a ground terminal in the electronic component 1. The substrate connecting electrode 12 defines and functions as a HOT terminal in the electronic component 1. The substrate connecting electrode 13 defines and functions as a COLD terminal in the electronic component 1. As long as the electronic component 1 includes at least two first substrate connecting electrodes, the number of other substrate connecting electrodes may be different. Additionally, the terminal function of each substrate connecting electrode may be different.

The substrate connecting electrodes 12, 13 are arranged in the depth direction of the substrate mounting surface 2 at the center in the lateral width direction of the substrate mounting surface 2. The substrate connecting electrodes 11A, 11B are arranged in the depth direction of the substrate mounting surface 2 on a first side with respect to the center in the lateral width direction of the substrate mounting surface 2. The substrate connecting electrodes 11C, 11D are arranged in the depth direction of the substrate mounting surface 2 on a second side with respect to the center in the lateral width direction of the substrate mounting surface 2.

The substrate 3 includes a resin laminate 30, component connecting electrodes 31A, 31B, 32, 33, and external connecting electrodes 41, 42, 43.

The resin laminate 30 is formed of liquid crystal polymer resin that is small in change in size due to moisture absorption or small in change of a dielectric constant, and is suitable for high accuracy of a circuit. The resin laminate 30 includes two principal planes facing each other, and preferably has a flat plate shape in which the thickness between the two principal planes is thin. One of the principal planes of the resin laminate 30 is the component loading surface 4 on which the electronic component 1 is mounted. The other principal plane of the resin laminate 30 is the external mounting surface 5.

The component connecting electrodes 31A, 31B, 32, 33 includes respective planar conductors provided on the component loading surface 4 separately from each other.

The component connecting electrodes 31A, 31B are each an example of a first component connecting electrode. The component connecting electrode 31A preferably has a rectangular or substantially rectangular shape extending in the depth direction on the first side with respect to the center in the lateral width direction of the component loading surface 4. The component connecting electrode 31B preferably has a rectangular or substantially rectangular shape extending in the depth direction on the second side with respect to the center in the lateral width direction of the component loading surface 4.

The component connecting electrode 32 and the component connecting electrode 33 are examples of a second component connecting electrode. The component connecting electrode 32 and the component connecting electrode 33 each preferably are square or substantially square, and arranged in the depth direction at the center in the lateral width direction of the component loading surface 4.

The substrate connecting electrodes 11A, 11B of the electronic component 1 are bonded to the component connecting electrode 31A. Therefore, the component connecting electrode 31A is a planar conductor continuously extending from a region, facing the substrate connecting electrode 11A of the electronic component 1, in the component loading surface 4 to a region, facing the substrate connecting electrode 11B, in the component loading surface 4.

The substrate connecting electrodes 11C, 11D of the electronic component 1 are bonded to the component connecting electrode 31B. Therefore, the component connecting electrode 31B is a planar conductor continuously extending from a region, facing the substrate connecting electrode 11C of the electronic component 1, in the component loading surface 4 to a region, facing the substrate connecting electrode 11D, in the component loading surface 4.

The substrate connecting electrode 12 of the electronic component 1 is bonded to the component connecting electrode 32. Therefore, the component connecting electrode 32 is a planar conductor provided in a region, facing the substrate connecting electrode 12 of the electronic component 1, in the component loading surface 4.

The substrate connecting electrode 13 of the electronic component 1 is bonded to the component connecting electrode 33. Therefore, the component connecting electrode 33 is a planar conductor continuously provided in a region, facing the substrate connecting electrode 13 of the electronic component 1, in the component loading surface 4.

The external connecting electrodes 41, 42, 43 are provided on the external mounting surface 5 of the resin laminate 30. The external connecting electrodes 41, 42, 43 include respective quadrilateral or substantially quadrilateral planar conductors provided on the external mounting surface 5 separately from each other. The external connecting electrode 41 is provided at the center in the lateral width direction of the external mounting surface 5. The external connecting electrode 42 is provided on the first side with respect to the center in the lateral width direction of the external mounting surface 5. The external connecting electrode 43 is provided on the second side with respect to the center in the lateral width direction of the external mounting surface 5. The external connecting electrode 41 is electrically conducted with the component connecting electrodes 31A, 31B through an internal wire. The second external connecting electrode 42 is electrically conducted with the component connecting electrode 32 through an internal wire. The third external connecting electrode 43 is electrically conducted with the component connecting electrode 33 through an internal wire.

Figure 3:
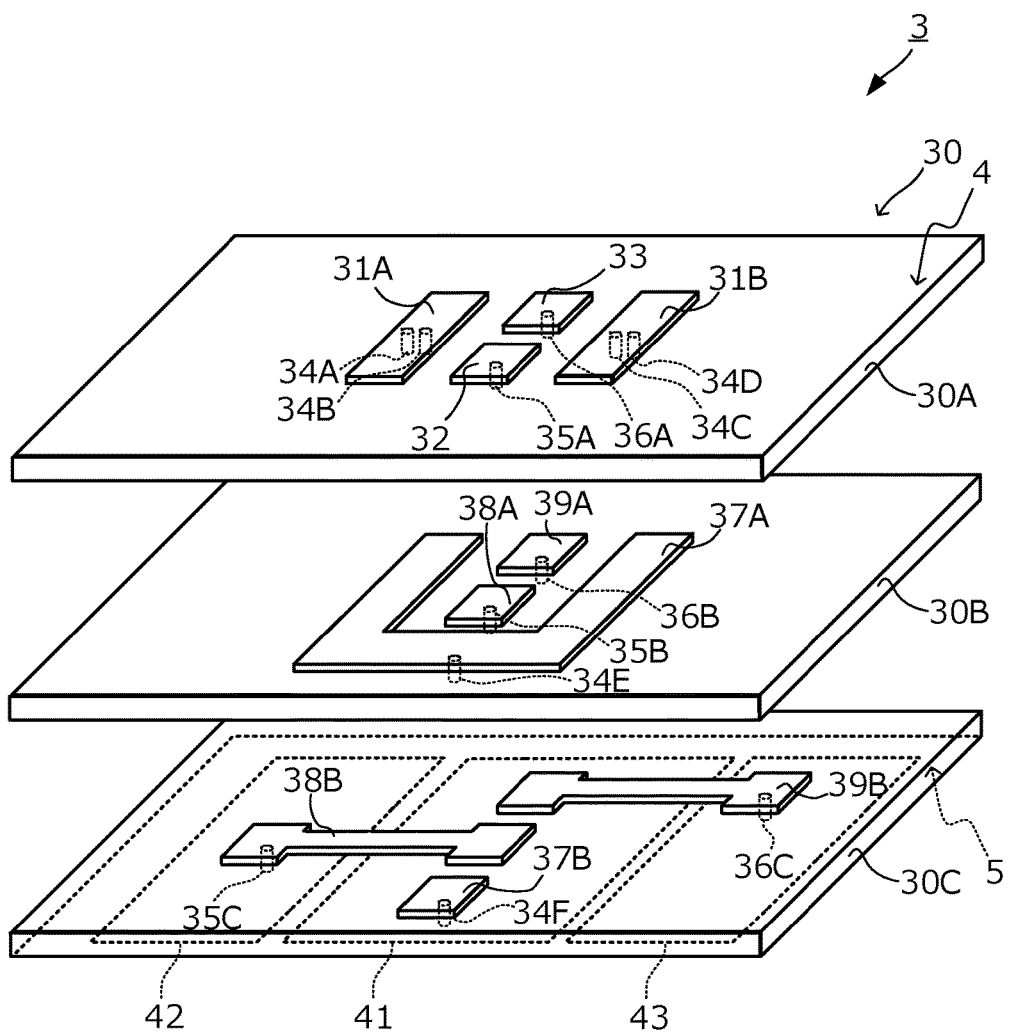
FIG. 3 is an exploded perspective view of a substrate provided in the module component according to the first preferred embodiment of the present invention.

FIG. 3 is an exploded perspective view of the substrate 3. The resin laminate 30 is multilayered by softening and press-bonding of liquid crystal polymer resin sheets 30A, 30B, 30C by heating. One surface of the liquid crystal polymer resin sheet 30A defines the component loading surface 4. One surface of the liquid crystal polymer resin sheet 30C defines the external mounting surface 5. The liquid crystal polymer resin sheet 30B is disposed between the liquid crystal polymer resin sheet 30A and the liquid crystal polymer resin sheet 30C. The liquid crystal polymer resin sheets 30A, 30B, 30C each are an example of a "thermoplastic resin base material".

The substrate 3 is provided with interlayer connection conductors 34A, 34B, 34C, 34D, 34E, 34F, 35A, 35B, 35C, 36A, 36B, 36C, and inner layer planar conductors 37A, 37B, 38A, 38B, 39A, 39B, inside the resin laminate 30. Through holes are provided in the liquid crystal polymer resin sheets 30A, 30B, 30C to be filled with conductive paste, and the conductive paste is solidified at the time of forming (heating and pressurizing) the resin laminate 30, so that the interlayer connection conductors 34A, 34B, 34C, 34D, 34E, 34F, 35A, 35B, 35C, 36A, 36B, 36C are provided.

The interlayer connection conductors 34A, 34B, 34C, 34D, 34E, 34F and the inner layer planar conductors 37A, 37B define the internal wire that electrically conducts the component connecting electrodes 31A, 31B with the external connecting electrode 41. The interlayer connection conductors 35A, 35B, 35C and the inner layer planar conductors 38A, 38B define the internal wire that electrically conducts the component connecting electrode 32 with the external connecting electrode 42. The interlayer connection conductors 36A, 36B, 36C and the inner layer planar conductors 39A, 39B define the internal wire that electrically conducts the component connecting electrode 33 with the external connecting electrode 43.

The interlayer connection conductors 34A, 34B, 34C, 34D, 35A, 36A are provided in the liquid crystal polymer resin sheet 30A, and pass through the liquid crystal polymer resin sheet 30A in the thickness direction.

The interlayer connection conductors 34A, 34B are each an example of a first interlayer connection conductor. The interlayer connection conductors 34A, 34B are electrically conducted with the first component connecting electrode 31A at ends reaching the component loading surface 4. More specifically, the interlayer connection conductors 34A, 34B are connected to the component connecting electrode 31A at a portion between a mounting region of the substrate connecting electrode 11A of the electronic component 1 and a mounting region of the substrate connecting electrode 11B.

The interlayer connection conductors 34C, 34D are also each examples of a first interlayer connection conductor. The interlayer connection conductors 34C, 34D are electrically conducted with the component connecting electrode 31B at ends reaching the component loading surface 4. More specifically, the interlayer connection conductors 34C, 34D are connected to the component connecting electrode 31B at a portion between a mounting region of the substrate connecting electrode 11C of the electronic component 1 and a mounting region of the substrate connecting electrode 11D.

The interlayer connection conductor 35A is electrically conducted with the component connecting electrode 32 at an end reaching the component loading surface 4. The interlayer connection conductor 36A is electrically conducted with the component connecting electrode 33 at an end reaching the component loading surface 4.

The inner layer planar conductors 37A, 38A, 39A are provided on a surface on a top surface side of the liquid crystal polymer resin sheet 30B, that is, on a liquid crystal polymer resin sheet 30A side. The inner layer planar conductor 37A, the inner layer planar conductor 38A, and the inner layer planar conductor 39A are planar conductors provided separately from each other.

The inner layer planar conductor 37A is an example of a first inner layer planar conductor. The inner layer planar conductor 37A preferably has a U-shape or substantially U-shape, and both ends face and overlap with the component connecting electrodes 31A, 31B. Additionally, the inner layer planar conductor 37A is electrically conducted with the component connecting electrodes 31A, 31B through the interlayer connection conductors 34A, 34B, 34C, 34D.

The inner layer planar conductor 38A preferably is square or substantially square, and faces and overlaps with the component connecting electrode 32. Additionally, the inner layer planar conductor 38A is electrically conducted with the component connecting electrode 32 through the interlayer connection conductor 35A.

The inner layer planar conductor 39A preferably is square or substantially square, and faces and overlaps with the component connecting electrode 33. Additionally, the inner layer planar conductor 39A is electrically conducted with the component connecting electrode 33 through the interlayer connection conductor 36A.

The interlayer connection conductors 34E, 35B, 36B are provided in the liquid crystal polymer resin sheet 30B, and pass through the liquid crystal polymer resin sheet 30B in the thickness direction. The interlayer connection conductor 34E is electrically conducted with the inner layer planar conductor 37A at an end on the top surface side. The interlayer connection conductor 35A is electrically conducted with the inner layer planar conductor 38A at an end on the top surface side. The interlayer connection conductor 36B is electrically conducted with the inner layer planar conductor 39A at an end on the top surface side.

The inner layer planar conductors 37B, 38B, 39B are provided on a surface on the top surface side of the liquid crystal polymer resin sheet 30C, that is, on a liquid crystal polymer resin sheet 30B side. The inner layer planar conductor 37B, the inner layer planar conductor 38B, and the inner layer planar conductor 39B are respective planar conductors provided separately from each other.

The inner layer planar conductor 37B preferably is square or substantially square, and is electrically conducted with the inner layer planar conductor 37A through the interlayer connection conductor 34E. That is, the inner layer planar conductor 37B is electrically conducted with the component connecting electrodes 31A, 31B through the interlayer connection conductor 34E, the inner layer planar conductor 37A, and the interlayer connection conductors 34A, 34B, 34C, 34D.

The inner layer planar conductor 38B preferably has an I-shaped or a substantially I-shaped portion extending in the lateral width direction, and one of the ends faces and overlaps with the component connecting electrode 32 and the inner layer planar conductor 38A. Additionally, the inner layer planar conductor 38B is electrically conducted with the inner layer planar conductor 38A through the interlayer connection conductor 35B. That is, the inner layer planar conductor 38B is electrically conducted with the component connecting electrode 32 through the interlayer connection conductor 35B, the inner layer planar conductor 38A, and the interlayer connection conductor 35A.

The inner layer planar conductor 39B has the I-shape portion or substantially I-shape portion extending in the lateral width direction, and one of ends faces and overlaps with the component connecting electrode 33 and the inner layer planar conductor 39A. Additionally, the inner layer planar conductor 39B is electrically conducted with the inner layer planar conductor 39A through the interlayer connection conductor 36B. That is, the inner layer planar conductor 39B is electrically conducted with the component connecting electrode 33 through the interlayer connection conductor 36B, the inner layer planar conductor 39A, and the interlayer connection conductor 36A.

The interlayer connection conductors 34F, 35C, 36C are provided in the liquid crystal polymer resin sheet 30C, and pass through the liquid crystal polymer resin sheet 30C in the thickness direction. The interlayer connection conductor 34F is electrically conducted with the inner layer planar conductor 37B at an end on the top surface side, and is electrically conducted with the external connecting electrode 41 at an end on a bottom surface side. The interlayer connection conductor 35C is electrically conducted with the inner layer planar conductor 38B at an end on the top surface side, and is electrically conducted with the external connecting electrode 42 at an end of the bottom surface side. The interlayer connection conductor 36C is electrically conducted with the inner layer planar conductor 39B at an end on the top surface side, and is electrically conducted with the external connecting electrode 43 at an end on the bottom surface side.

The resin laminate 30 includes liquid crystal polymer resin causing uniaxial or biaxial crystalline orientation along the component loading surface 4. Therefore, the resin laminate 30 has anisotropy of an elastic modulus in the in-plane direction on the component loading surface 4. The liquid crystal polymer resin has a material having high softness, and the resin laminate 30 has flexibility as a whole. Additionally, the liquid crystal polymer resin has a material having thermoplasticity, and the resin laminate 30 has a quality of softening with increase in a temperature. As the material of the resin laminate 30, a thermoplastic resin material such as polyimide other than liquid crystal polymer resin may be used. However, the resin laminate 30 preferably is formed by heating and pressurizing of liquid crystal polymer resin sheets and laminating of the heated and pressurized liquid crystal polymer resin sheets, so that the resin laminate 30 has higher moisture resistance compared to a case where the resin laminate 30 is formed of polyimide, and a change in a dielectric constant upon moisture absorption or change in size is significantly reduced or prevented.

In the module component 9, the electronic component 1 and the substrate 3 are bonded to each other by the ultrasonic bonding method. Specifically, in a state where the electronic component 1 is in contact with the substrate 3, the electronic component 1 is ultrasonically oscillated, so that frictional heat is generated on a contact surface of the electronic component 1 and the substrate 3, the substrate connecting electrodes 11A, 11B, 11C, 11D, 12, 13 of the electronic component 1, and the component connecting electrodes 31A, 31B, 32, 33 of the substrate 3 are directly welded to each other by this frictional heat. The electronic component 1 is mounted on the substrate 3 by using the ultrasonic bonding method, so that the quantity of heat generated as the frictional heat of the electronic component 1 and the substrate 3 is significantly smaller than the quantity of heat generated by a method of soldering or the like, the thermoplastic resin is hardly softened in the substrate 3, and the mounting region of the electronic component 1 is prevented from locally caving in the component loading surface 4 of the substrate 3.

The substrate 3 is made of a liquid crystal polymer, and therefore while the anisotropy of an elastic modulus exists in the in-plane direction of the component loading surface 4, the component connecting electrodes 31A, 31B are provided on the substrate 3 so as to have large areas. Consequently, it is possible to significantly reduce or prevent deformation of the thermoplastic resin near the component connecting electrodes 31A, 31B. Additionally, the component connecting electrode 32 and the component connecting electrode 33 having small areas are disposed so as to be interposed between the two component connecting electrodes 31A, 31B having large areas, and therefore it is possible to significantly reduce or prevent deformation of the thermoplastic resin also near the component connecting electrode 32 or the component connecting electrode 33. Consequently, even when the electronic component 1 is mounted on the substrate 3 by a method involving oscillation or generation of frictional heat (heat generation) such as the ultrasonic bonding method, the electronic component 1 and the substrate 3 are stably bonded to each other with sufficient bond strength.

Moreover, the inner layer planar conductor 37A of a first layer close to the component loading surface 4 faces and overlaps with the component connecting electrode 31A and the component connecting electrode 31B, and therefore it is possible to significantly reduce or prevent the deformation of the thermoplastic resin even near the inner layer planar conductor 37A. Similarly, the inner layer planar conductor 38A and the inner layer planar conductor 39A of a first layer close to the component loading surface 4 face and overlap with the component connecting electrode 32 and the component connecting electrode 33, respectively, and therefore it is possible to significantly reduce or prevent deformation of the thermoplastic resin even near the inner layer planar conductor 38A and the inner layer planar conductor 39A. Therefore, with these configurations, it is possible to effectively significantly reduce or prevent the deformation in the mounting region of the electronic component 1.

Furthermore, a plurality of the interlayer connection conductors 34A, 34B and a plurality of the interlayer connection conductors 34C, 34D are electrically conducted with the component connecting electrode 31A and the component connecting electrode 31B, respectively, and therefore it is possible to significantly reduce or prevent the deformation of the thermoplastic resin also near the interlayer connection conductors 34A, 34B and the interlayer connection conductors 34C, 34D, and it is possible to effectively significantly reduce or prevent the deformation in the mounting region of the electronic component 1. However, minute swelling is generated directly above connection positions with the interlayer connection conductors 34A, 34B and the interlayer connection conductors 34C, 34 in the component connecting electrode 31A and the component connecting electrode 31B. Therefore, the respective connection positions with the interlayer connection conductors 34A, 34B and the interlayer connection conductors 34C, 34 in the component connecting electrode 31A and the component connecting electrode 31B are located at portions so as not to face the substrate connecting electrodes 11A, 11B and the substrate connecting electrodes 11C, 11D of the electronic component 1. Consequently, in the mounting region of the electronic component 1, the connection positions of the interlayer connection conductors 34A, 34B and the interlayer connection conductors 34C, 34D are deviated from the facing positions with the substrate connecting electrodes 11A, 11B, 11C, 11D in the electronic component 1, and flatness in the facing positions with the substrate connecting electrodes 11A, 11B, 11C, 11D is prevented from being impaired. This also contributes to stably bond the electronic component 1 to the substrate 3 with sufficient bond strength.

The component connecting electrodes 31A, 31B extend on the component loading surface 4 such that the depth directions are the long side directions, and therefore the elastic modulus in the depth direction of the component loading surface 4 is improved (increased) compared to the elastic modulus in the lateral width direction of the component loading surface 4. Therefore, the first component connecting electrodes are provided on the substrate 3 made of a liquid crystal polymer and having anisotropy in an elastic modulus such that the long sides extend in a direction in which the elastic modulus is low, so that it is possible to significantly reduce or prevent the anisotropy of the elastic modulus. Consequently, it is possible to isotropically generate the deformation generated in the mounting region of the electronic component 1 when electronic component 1 is mounted. Therefore, it is possible to more stably bond the electronic component 1 to the substrate 3.

Now, a module component 59 according to a second preferred embodiment of the present invention will be described. In the following description, configurations similar to the configurations described in the first preferred embodiment are denoted by the same reference numerals.

Figure 4:
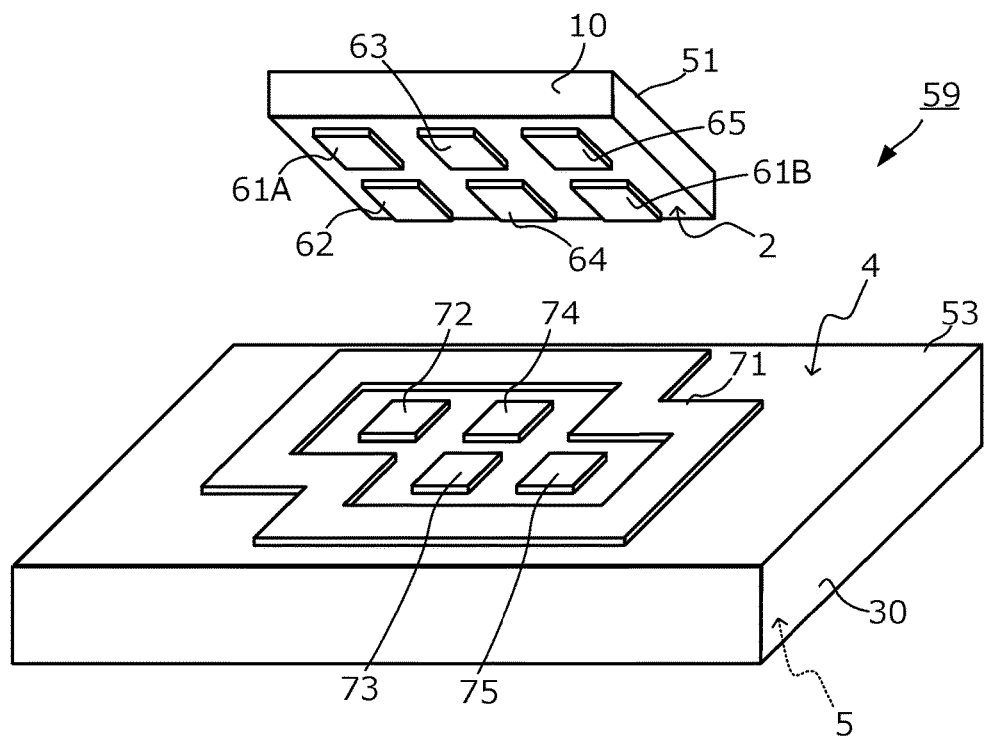
FIG. 4 is an exploded schematic perspective view of a module component according to a second preferred embodiment of the present invention.

FIG. 4 is an exploded schematic perspective view of the module component 59. The module component 59 includes an electronic component 51 and a substrate 53.

The electronic component 51 includes a body 10, and substrate connecting electrodes 61A, 61B, 62, 63, 64, 65. The substrate connecting electrodes 61A, 61B, 62, 63, 64, 65 preferably are respective square or substantially square planar conductors provided on a substrate mounting surface 2 separately from each other. Herein, each three of the substrate connecting electrodes 61A, 61B, 62, 63, 64, 65 are arranged in two lines along the lateral width direction on the substrate mounting surface 2.

The substrate connecting electrodes 61A, 61B are examples of respective first substrate connecting electrodes, and are connected at a same potential or substantially a same potential. Herein, the substrate connecting electrodes 61A, 61B are disposed at positions corresponding to facing angular portions in the arrangement of the substrate connecting electrodes 61A, 61B, 62, 63, 64, 65. The substrate connecting electrodes 62, 63, 64, 65 are each an example of a second substrate connecting electrode, and are connected at a different potential or a substantially different potential from the substrate connecting electrodes 61A, 61B.

The substrate 53 includes a resin laminate 30, and component connecting electrodes 71, 72, 73, 74, 75. The component connecting electrodes 71, 72, 73, 74, 75 include respective planar conductors provided on a component loading surface 4 separately from each other.

The component connecting electrode 71 is an example of a first component connecting electrode. The component connecting electrode 71 preferably has a square or substantially annular shape including an opening. The component connecting electrodes 72, 73, 74, 75 are examples of a second component connecting electrode. The component connecting electrodes 72, 73, 74, 75 preferably are square or substantially square, and are disposed in the opening of the component connecting electrode 71.

Both of the substrate connecting electrodes 61A, 61B of the electronic component 51 are bonded to the component connecting electrode 71. Therefore, the component connecting electrode 71 is an annular or substantially annular continuous planar conductor on the component loading surface 4 that faces and overlaps with a region facing the substrate connecting electrode 61A of the electronic component 51 and a region facing the substrate connecting electrode 61B, and surrounds the peripheries of other substrate connecting electrodes 62, 63, 64, 65.

The substrate connecting electrode 62 of the electronic component 51 is bonded to the component connecting electrode 72. Therefore, the component connecting electrode 72 is a planar conductor provided in a region, facing the substrate connecting electrode 62 of the electronic component 51, in the component loading surface 4. The substrate connecting electrode 63 of the electronic component 51 is bonded to the component connecting electrode 73. Therefore, the component connecting electrode 73 is a planar conductor provided in a region, facing the substrate connecting electrode 63 of the electronic component 51, in the component loading surface 4. The substrate connecting electrode of the electronic component 51 is bonded to the component connecting electrode 74. Therefore, the component connecting electrode 74 is a planar conductor provided in a region, facing the substrate connecting electrode 64 of the electronic component 51, in the component loading surface 4. The substrate connecting electrode 65 of the electronic component 51 is bonded to the component connecting electrode 75. Therefore, the component connecting electrode 75 is a planar conductor provided in a region, facing the substrate connecting electrode 65 of the electronic component 51, in the component loading surface 4.

On the external mounting surface 5 of a resin laminate 30, a plurality of respective external connecting electrodes (not illustrated) that are electrically conducted with the component connecting electrodes 71, 72, 73, 74, 75 are provided. Additionally, inside the resin laminate 30, a plurality of internal wires (including interlayer connection conductors and inner layer planar conductors) (not illustrated) that are electrically conducted with the component connecting electrodes 71, 72, 73, 74, 75 are provided.

Also in the module component 59, the electronic component 51 and the substrate 53 are bonded to each other by an ultrasonic bonding method, similarly to the first preferred embodiment. Therefore, even in the substrate 53 made of thermoplastic resin, a mounting region of the electronic component is prevented from locally caving in the component loading surface 4. Additionally, the component connecting electrode 71 has a large area, and therefore the electronic component 51 and the substrate 53 are able to be stably bonded to each other with sufficient bond strength. In this configuration, the peripheries of the component connecting electrodes 72, 73, 74, 75 are completely surrounded by the component connecting electrode 71, and therefore it is possible to significantly reduce or prevent deformation of the thermoplastic resin near the component connecting electrodes 72, 73, 74, 75, and the electronic component 51 and the substrate 53 are extremely stably bonded to each other.

As inner layer planar conductors provided close to the component connecting electrodes 71, 72, 73, 74, 75 on a first layer inside the resin laminate 30, the conductors having the shape described in the first preferred embodiment can be used, but conductors having shapes almost congruent with the component connecting electrodes 71, 72, 73, 74, 75 are more desirably used. With such a configuration, the deformation of the thermoplastic resin in the mounting region of the electronic component 1 is able to be further significantly reduced or prevented by the inner layer planar conductors that face and overlap with the component connecting electrodes 71, 72, 73, 74, 75.

As the interlayer connection conductor connected to the component connecting electrode 71, a plurality of interlayer connection conductors are preferably arranged along the annular shape of the component connecting electrode 71. With this configuration, it is possible to effectively significantly reduce or prevent the deformation in the mounting region of the electronic component 51.

As described in each of the above preferred embodiments, the present invention can be implemented, but the material of the substrate of the present invention is not limited to the material having flexibility such as liquid crystal polymer resin, and a material having no flexibility may be used as long as the material is thermoplastic resin. Additionally, module components of various preferred embodiments of the present invention are not limited to the surface mounting type configuration, and other configurations may be used. For example, a configuration in which the electronic component is mounted on a flexible cable type substrate can also be used. The electronic component may be incorporated in the substrate, in addition to a configuration in which the electronic component is mounted on the substrate surface.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A module component comprising:
    a substrate including a thermoplastic resin base material; and
    an electronic component ultrasonically bonded on the substrate; wherein
    the electronic component includes a plurality of first substrate connecting electrodes including respective planar conductors provided on a substrate mounting surface separately from each other, and connected at a same potential or substantially a same potential;
    the substrate includes a first component connecting electrode including a planar conductor provided on a component loading surface, and bonded to the plurality of first substrate connecting electrodes; and
    the substrate has anisotropy of an elastic modulus in an in-plane direction on the component loading surface.

2. The module component according to claim 1, wherein the electronic component further includes a second substrate connecting electrode including a planar conductor provided on the substrate mounting surface separately from the first substrate connecting electrodes, and connected at a different potential or a substantially different potential from the first substrate connecting electrodes;
the substrate further includes a second component connecting electrode including a planar conductor provided on the component loading surface separately from the first component connecting electrode, and bonded to the second substrate connecting electrode; and
the first component connecting electrode surrounds the second component connecting electrode.

3. The module component according to claim 1, wherein the substrate further includes a first interlayer connection conductor provided inside the substrate and electrically conducted with the first component connecting electrode.

4. The module component according to claim 3, wherein the substrate includes a plurality of the first interlayer connection conductors.

5. The module component according to claim 3, wherein the first interlayer connection conductor is electrically conducted with a portion between respective bonding regions of the plurality of first substrate connecting electrodes, in one of the first component connecting electrodes.

6. The module component according to claim 3, wherein the substrate further includes a first inner layer planar conductor electrically conducted with the first component connecting electrode through the first interlayer connection conductor.

7. The module component according to claim 6, wherein the first inner layer planar conductor overlaps with the first component connecting electrode.

8. The module component according to claim 1, wherein the first component connecting electrode has a long side and a short side, and an elastic modulus of the substrate in a direction in which the long side of the first component connecting electrode extends is lower than an elastic modulus of the substrate in a direction in which the short side of the first component connecting electrode extends.

9. The module component according to claim 1, wherein the plurality of first substrate connecting electrodes are arranged in two lines along a lateral width direction on the substrate mounting surface.

10. The module component according to claim 1, further comprising a plurality of second substrate connecting electrodes connected at a different potential or a substantially different potential from the plurality of first substrate connecting electrodes.

11. The module component according to claim 1, wherein the thermoplastic resin base material is a liquid crystal polymer.

12. The module component according to claim 1, wherein the thermoplastic resin base material includes a plurality of liquid crystal polymer resin sheets.

13. The module component according to claim 12, further comprising at least one interlayer connection conductor provided inside the substrate and electrically conducted with the first component connecting electrode, wherein the at least one interlayer connection conductor is provided in at least one of the plurality of liquid crystal polymer resin sheets, and passes through the at least one of the plurality of liquid crystal polymer resin sheets in a thickness direction thereof.

14. The module component according to claim 1, wherein the thermoplastic resin base material causes uniaxial or biaxial crystalline orientation along the component loading surface.

15. The module component according to claim 1, wherein the substrate including the thermoplastic resin base material is a resin laminate that has anisotropy of an elastic modulus in an in-plane direction on the component loading surface.

16. The module component according to claim 1, wherein the thermoplastic resin base material is a polyimide.

17. The module component according to claim 1, wherein the substrate connecting electrodes of the electronic component and the component connecting electrodes of the substrate are directly welded to each other.

18. The module component according to claim 1, wherein the thermoplastic resin base material has flexibility.

19. The module component according to claim 1, wherein the thermoplastic resin base material has no flexibility.

* * * * *